United States Patent
Jeong et al.

(10) Patent No.: US 7,488,981 B2
(45) Date of Patent: Feb. 10, 2009

(54) MEMORY DEVICES HAVING SHARP-TIPPED PHASE CHANGE LAYER PATTERNS

(75) Inventors: Won-Cheol Jeong, Seoul (KR); Hyeong-Jun Kim, Seoul (KR); Jae-Hyun Park, Gyeonggi-do (KR); Chang-Wook Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 580 days.

(21) Appl. No.: 11/018,643

(22) Filed: Dec. 21, 2004

(65) Prior Publication Data

US 2005/0139816 A1 Jun. 30, 2005

(30) Foreign Application Priority Data

Dec. 30, 2003 (KR) .................. 10-2003-0100470

(51) Int. Cl.
- H01L 27/108 (2006.01)
- H01L 29/00 (2006.01)
- H01L 31/036 (2006.01)
- H01L 31/112 (2006.01)

(52) U.S. Cl. .............. 257/68; 257/E29.17; 257/69

(58) Field of Classification Search .......... 257/2, 257/3, 4, 5, E29.17, 68, 69, 71, 296, 678
See application file for complete search history.

(56) References Cited

U.S. PATENT DOCUMENTS

| | | | |
|---|---|---|---|
| 5,789,758 A | 8/1998 | Reinberg | |
| 6,147,395 A | 11/2000 | Gilgen | |
| 6,586,761 B2 | 7/2003 | Lowrey | |
| 6,908,812 B2 * | 6/2005 | Lowrey | 438/253 |
| 6,998,289 B2 * | 2/2006 | Hudgens et al. | 438/95 |
| 7,067,837 B2 * | 6/2006 | Hwang et al. | 257/3 |
| 7,402,897 B2 * | 7/2008 | Leedy | 257/678 |
| 2003/0047727 A1 | 3/2003 | Chiang | |
| 2006/0211165 A1 * | 9/2006 | Hwang et al. | 438/95 |

OTHER PUBLICATIONS

Lee et al., *Phase Change Memory Devices Having Phase Change Area in Porous Dielectric Layer and Methods for Manufacturing the Same*, U.S. Appl. No. 10/827,687, filed Apr. 19, 2004.

Hideki, *Phase Changeable Memory Devices Including Carbon Nano Tubes and Methods for Forming the Same*, U.S. Appl. No. 10/827,639, filed Apr. 19, 2004.

* cited by examiner

*Primary Examiner*—Charles D. Garber
*Assistant Examiner*—Kenisha V Ford
(74) *Attorney, Agent, or Firm*—Myers Bigel Sibley & Sajovec, P.A.

(57) ABSTRACT

Phase change Random Access Memory (PRAM) devices include a substrate and a phase change layer pattern on the substrate. The phase change layer pattern includes a sharp tip and at least one wall that extends from the sharp tip in a direction away from the substrate. At least one contact hole node is provided that contacts the phase change material pattern adjacent the sharp tip.

26 Claims, 12 Drawing Sheets

MEMORY DEVICES HAVING SHARP-TIPPED PHASE CHANGE LAYER PATTERNS

CROSS-REFERENCE TO RELATED APPLICATION

This patent application claims the benefit under 35 USC §119 of Korean Patent Application No. 10-2003-0100470, filed Dec. 30, 2003, the disclosure of which is hereby incorporated herein by reference in its entirety.

FIELD OF THE INVENTION

This invention relates to memory devices and methods of forming the same, and more particularly, to memory devices having a phase change layer pattern and methods of forming the same.

BACKGROUND OF THE INVENTION

Phase change Random Access Memory (PRAM) devices are well known. PRAM devices are described, for example, in U.S. application Ser. No. 10/827,687, filed Apr. 19, 2004, entitled Phase Change Memory Devices Having Phase Change Area In Porous Dielectric Layer And Methods For Manufacturing The Same, and U.S. application Ser. No. 10/827,639, filed Apr. 19, 2004, entitled Phase Changeable Memory Devices Including Carbon Nano Tubes And Methods For Forming The Same, both of which are assigned to the assignee of the present invention, the disclosures of which are incorporated herein by reference in their entireties as if set forth fully herein.

Generally, a PRAM is a semiconductor memory device that stores binary data by using an electrical property of a phase change layer pattern. The phase change layer pattern has a crystalline structure or an amorphous structure according to temperatures during the operation of the PRAM. The temperatures of the phase change layer pattern may be generated by Joule heat by the current applied to the pattern. The binary data may be defined as "0" when the phase change layer pattern has a crystalline structure having a low resistance, and the binary data may be defined as "1" when the phase change layer pattern has an amorphous structure having a high resistance.

A PRAM may consume relatively high current, particularly when the phase change layer pattern changes from the crystalline structure to the amorphous structure, because the phase change layer pattern may emit much more Joule heat in the amorphous structure compared to the crystalline structure. When the phase change layer pattern has a bar shape and contacts a contact node, it may be desirable to decrease a contact area between them, in order to reduce the current for the amorphous structure. Further, if the phase change layer pattern is formed in a contact hole, and contacts the contact node, it may be desirable for the PRAM to have a larger portion of the phase change layer pattern change the amorphous structure and have more Joule heat emit from a sidewall of the phase change layer pattern compared with a bar shape phase change layer.

U.S. Pat. No. 6,147,395 to Gilgen discloses a method for fabricating a small area of contact between electrodes. As stated in the Abstract of this patent, "[a]n electrode structure for use in a chalcogenide memory is disclosed. The electrode has a substantially Frusto-conical shape, and is preferably formed by undercut etching a polysilicon layer beneath an oxide pattern. With this structure, improved current densities through the chalcogenide material can be achieved".

Moreover, U.S. Pat. No. 6,586,761 to Lowrey also describes a phase change material memory device. As stated in the Abstract of this patent, "[a] phase change material memory cell may be formed with singulated, cup-shaped phase change material. The interior of the cup-shaped phase change material may be filled with a thermal insulating material. As a result, heat losses upwardly through the phase change material may be reduced and adhesion problems between the phase change material and the rest of the device may likewise be reduced in some embodiments. In addition, a barrier layer may be provided between the upper electrode and the remainder of the device that may reduce species incorporation from the top electrode into the phase change material, in some embodiments. Chemical mechanical planarization may be utilized to define the phase change material reducing the effects of phase change material dry etching in some embodiments".

It may be difficult to uniformly form a Frusto-conical shaped tip in the lower electrode using conventional semiconductor fabrication processes. This difficulty may arise because the Frusto-conical shaped tip may be formed by performing an undercut etching process in the lower electrode. It may be difficult to control an extent of etching the lower electrode during the undercut etching process.

SUMMARY OF THE INVENTION

Phase change Random Access Memory (PRAM) devices according to embodiments of the present invention include a substrate and a phase change layer pattern on the substrate. The phase change layer pattern includes a sharp tip and at least one wall that extends from the sharp tip away from the substrate. At least one contact is provided that contacts the phase change material pattern adjacent the sharp tip.

In some embodiments, this phase change layer pattern is V-shaped in side cross-section, with the sharp tip defining a vertex of the V and the at least one wall defining at least one leg of the V. In other embodiments, the phase change layer pattern is cone-shaped, with the sharp tip defining a vertex of the cone and the at least one wall defining a wall of the cone. In other embodiments, the at least one wall extends from the sharp tip away from the substrate and beyond the at least one contact.

In still other embodiments, the phase change layer pattern including a sharp tip and at least one wall that extends from the sharp tip away from the substrate defines an outside surface adjacent the substrate and an inside surface remote from the substrate. In these embodiments, the at least one contact includes a first contact that extends from adjacent the substrate to contact the sharp tip at the outside surface, and a second contact that contacts the sharp tip at the inside surface and extends away from the substrate.

In still other embodiments, an insulating layer is provided on the substrate and includes a hole therein. The sharp tip is within the hole, and the at least one wall extends from the sharp tip beyond the hole.

Methods of fabricating PRAM devices according to exemplary embodiments of the present invention form a support interlayer insulating layer including a lower contact hole on a substrate. A contact hole spacer is formed on a sidewall of the lower contact hole. A lower contact hole node is formed in the contact hole spacer. An etch stop layer and a pattern interlayer insulating layer are formed on the semiconductor substrate including on the lower contact hole node. A middle contact hole is formed on the etch stop layer by penetrating the pattern interlayer insulating layer. The pattern interlayer insulating layer and the etch stop layer are then etched through the middle contact hole, to form a V-shaped contact hole that exposes the lower contact hole node. A phase change layer pattern is then conformally formed in the V-shaped contact hole.

DETAILED DESCRIPTION OF THE INVENTION

Figure 1:
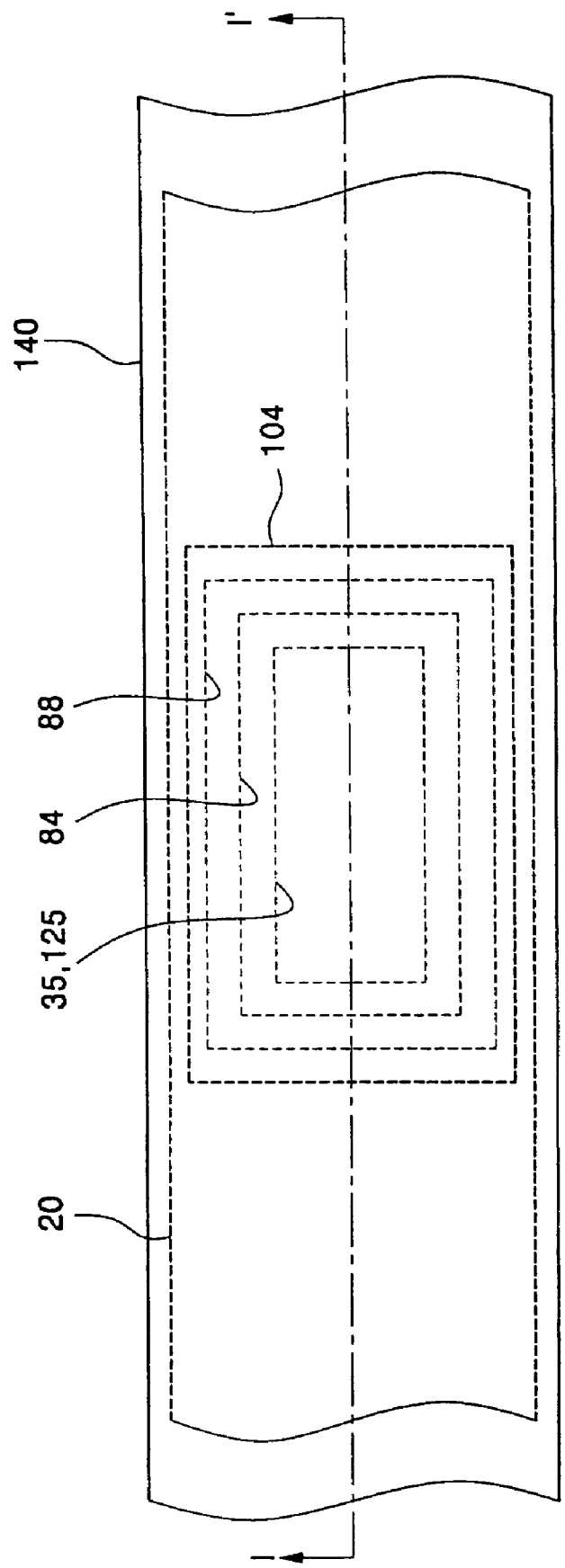
FIG. 1 is a layout of a semiconductor device according to exemplary embodiments of the invention.

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items and may be abbreviated as "/".

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 2:
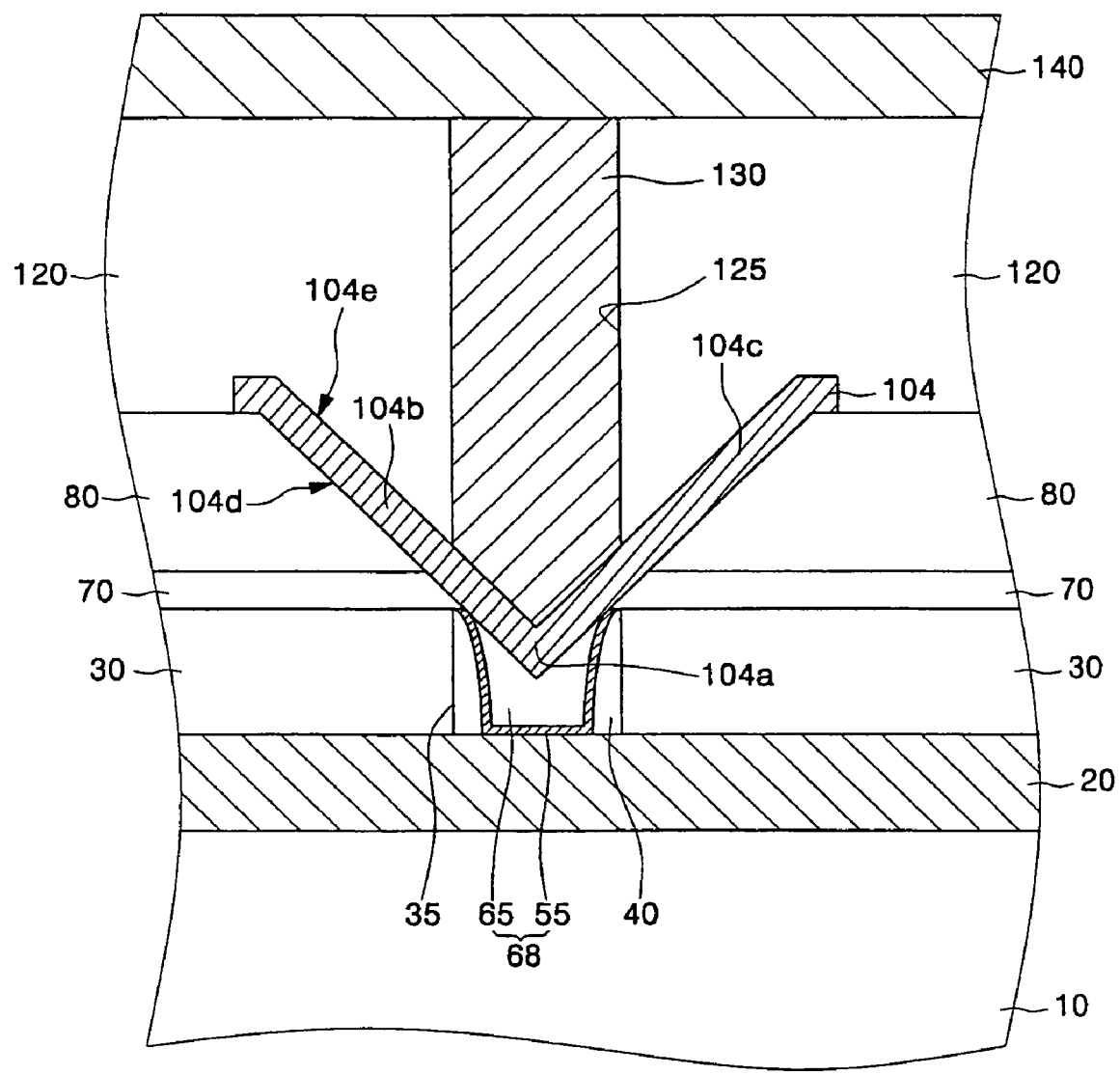
FIG. 2 is a sectional view of a semiconductor memory device according to exemplary embodiments of the invention taken along line I-I' of FIG. 1.

FIG. 1 is a layout of a semiconductor memory device according to exemplary embodiments of the invention. FIG. 2 is a sectional view of a semiconductor memory device taken along line I-I' of FIG. 1 according to exemplary embodiments of the invention.

Referring to FIGS. 1 and 2, a phase change layer pattern 104 is disposed above a substrate such as semiconductor substrate 10. The phase change layer pattern 104 is a V-shaped structure having a sharp tip directed downward toward the semiconductor substrate 10. A portion of a lower surface of the phase change layer pattern 104 is surrounded by an etch stop layer 70 and a pattern interlayer insulating layer 80 stacked thereon. The phase change layer pattern 104 comprises material of at least three elements and, in some embodiments, the phase change layer pattern 104 comprises a mixture of germanium (Ge), antimony (Sb), and tellurium (Te). In some embodiments, the phase change layer pattern 104 has an etching ratio different from the pattern interlayer insulating layer 80, and the pattern interlayer insulating layer 80 is an insulating layer having an etching ratio different from the etch stop layer 70.

A support interlayer insulating layer 30 is disposed between the etch stop layer 70 and the semiconductor substrate 10, and the support interlayer insulating layer 30 has a lower contact hole 35 therein. The lower contact hole 35 includes therein, and in some embodiments is filled with, a contact hole spacer 40 and a lower contact hole node 68. On the semiconductor substrate 10 there is disposed a lower line 20, which contacts the lower contact hole node 68 through the lower contact hole 35. The lower line 20 comprises a tungsten (W) layer in some embodiments. The contact hole spacer 40 is on, and in some embodiments covers, a sidewall of the lower contact hole 35. The lower contact hole node 68 comprises a titanium (Ti) layer pattern 55 and a titanium nitride (TiN) layer pattern 65 stacked thereon in some embodiments, which contact the contact hole spacer 40 and are on, and in some embodiments cover, the bottom of the lower contact hole 35. The support interlayer insulating layer 30 is an insulating layer having an etching ratio different from the etch stop layer 70 and the same etching ratio as the pattern interlayer insulating layer 80 in some embodiments. The contact hole spacer 40 has the same etching ratio as the etch stop layer 70 in some embodiments.

On the pattern interlayer insulating layer 80 there is disposed a line interlayer insulating layer 120 covering the phase change layer pattern 104. The line interlayer insulating layer 120 includes an upper contact hole 125. The upper contact hole 125 contains therein, and in some embodiments is filled with, an upper contact hole node 130, and the upper contact hole node 130 is a tungsten (W) layer in some embodiments. The upper contact hole node 130 is connected to the phase change layer pattern 104 through the upper contact hole 125. On the line interlayer insulating layer 120 there is disposed an upper line 140, being in contact with the upper contact hole node 130. The upper line 140 is an aluminum (Al) layer in some embodiments, and the line interlayer insulating layer 120 is an insulating layer having the same etching ratio as the pattern interlayer insulating layer 80 in some embodiments.

As such, a portion of the lower surface of the phase change layer pattern 104 contacts the lower contact hole node 68, and the sharp tip of the phase change layer pattern 104 is disposed on a central axis of the lower contact hole 35 and is located in a predetermined portion of the lower contact hole node 68. The lower contact hole 35 and the upper contact hole 125 are coaxially aligned in some embodiments. A diameter of the lower contact hole 35 is smaller than a width of the phase change layer pattern 104 in some embodiments.

Accordingly, FIG. 2 also illustrates PRAM devices according to exemplary embodiments of the present invention that include a substrate 10 and a phase change layer pattern 104 on the substrate. The phase change layer pattern includes a sharp tip 104a and at least one wall 104b, 104c that extends from the sharp tip 104a away from the substrate 10, shown as upwardly in FIG. 2. At least one contact hole node 68, 130 contacts the phase change layer pattern 104 adjacent the sharp tip 104a.

FIG. 2 also illustrates some embodiments of the present invention, wherein the phase change layer pattern 104 is V-shaped in side cross-section, with the sharp tip 104a defining a vertex of the V and the at least one wall 104b, 104c defining at least one leg of the V. FIG. 2 also illustrates other embodiments of the present invention, wherein the phase change layer pattern 104 is cone-shaped, with the sharp tip 104a defining a vertex of the cone and the at least one wall 104b, 104c defining a wall of a cone. It will be understood that these embodiments are not illustrated in FIG. 1. As also shown in FIG. 2, in some embodiments, the at least one wall 104b, 104c extends from the sharp tip 104a away from the substrate and extends laterally beyond the at least one contact hole node 68, 130.

Still referring to FIG. 2, the phase change layer pattern 104 defines an outside surface 104d facing the substrate 10, and an inside surface 104e remote from the substrate. The at least one contact hole node includes a first contact hole node 68 that extends from adjacent the substrate 10 to contact the sharp tip 104a at the outside surface 104d. A second contact hole node 130 contacts the sharp tip 104a at the inside surface 104e and extends away from the substrate 10. Finally, embodiments of FIG. 2 also illustrate an insulating layer 30 on the substrate, including a hole 35 therein, wherein the sharp tip 104a is within the hole and the at least one wall 104b, 104c extends from the sharp tip 104a beyond the hole 35.

Methods of fabricating PRAM devices having a phase change layer pattern according to embodiments of the invention, and PRAM devices so fabricated will be explained with reference to the accompanying drawings.

Figure 11:
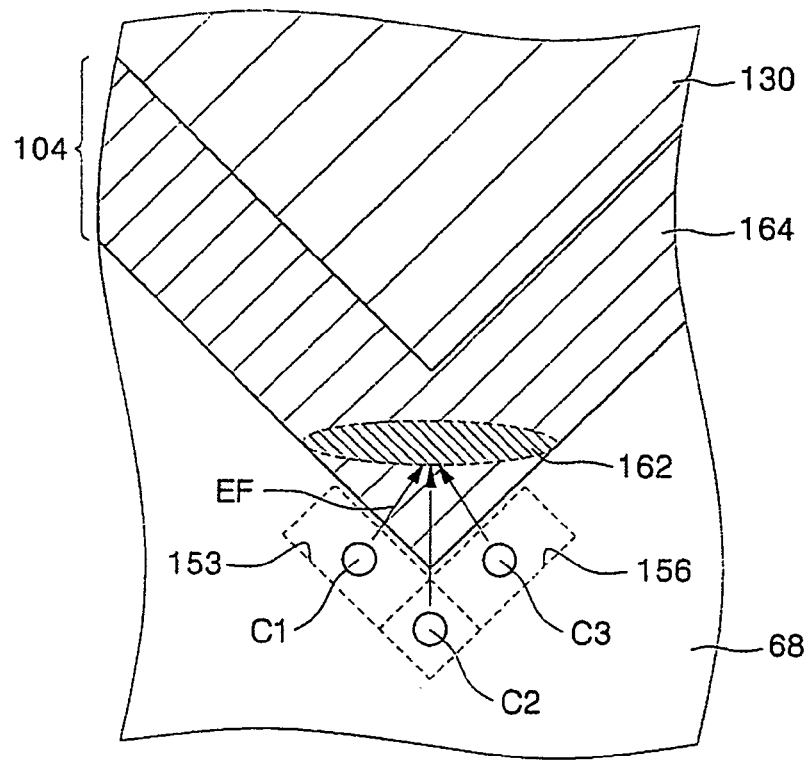
FIGS. 11 and 12 are schematic enlarged views illustrating portions of FIGS. 9 and 10, respectively.
Figure 12:
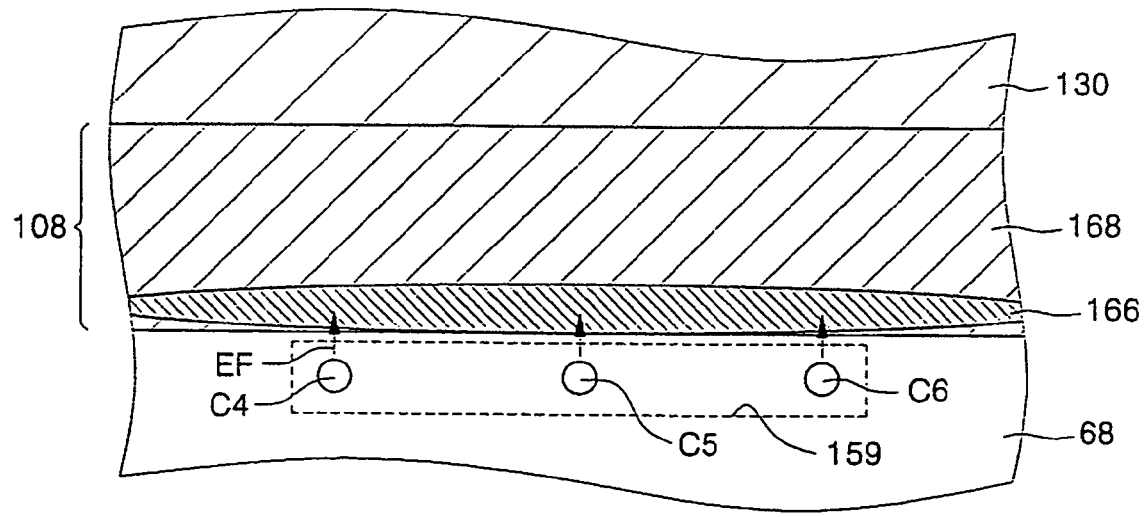

FIGS. 3 through 9 are sectional views illustrating methods of forming devices according to exemplary embodiments of the invention. FIG. 10 is a sectional view of a conventional semiconductor memory device illustrating a portion to be compared with FIG. 9. FIGS. 11 and 12 are schematic enlarged views illustrating portions of FIGS. 9 and 10, respectively.

Figure 3:
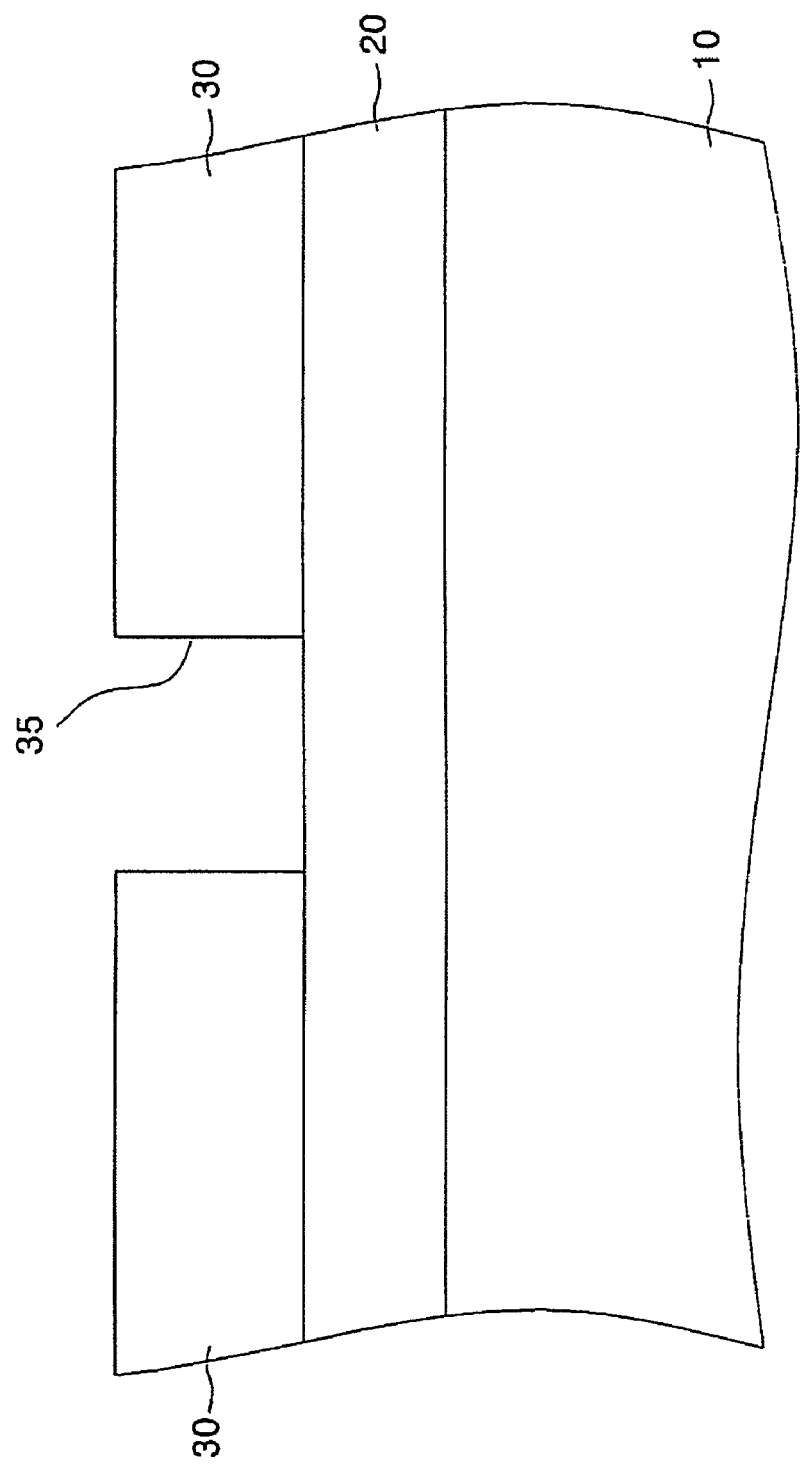
FIGS. 3 through 9 are sectional views illustrating methods of forming a semiconductor device and devices so formed according to exemplary embodiments of the invention.
Figure 4:
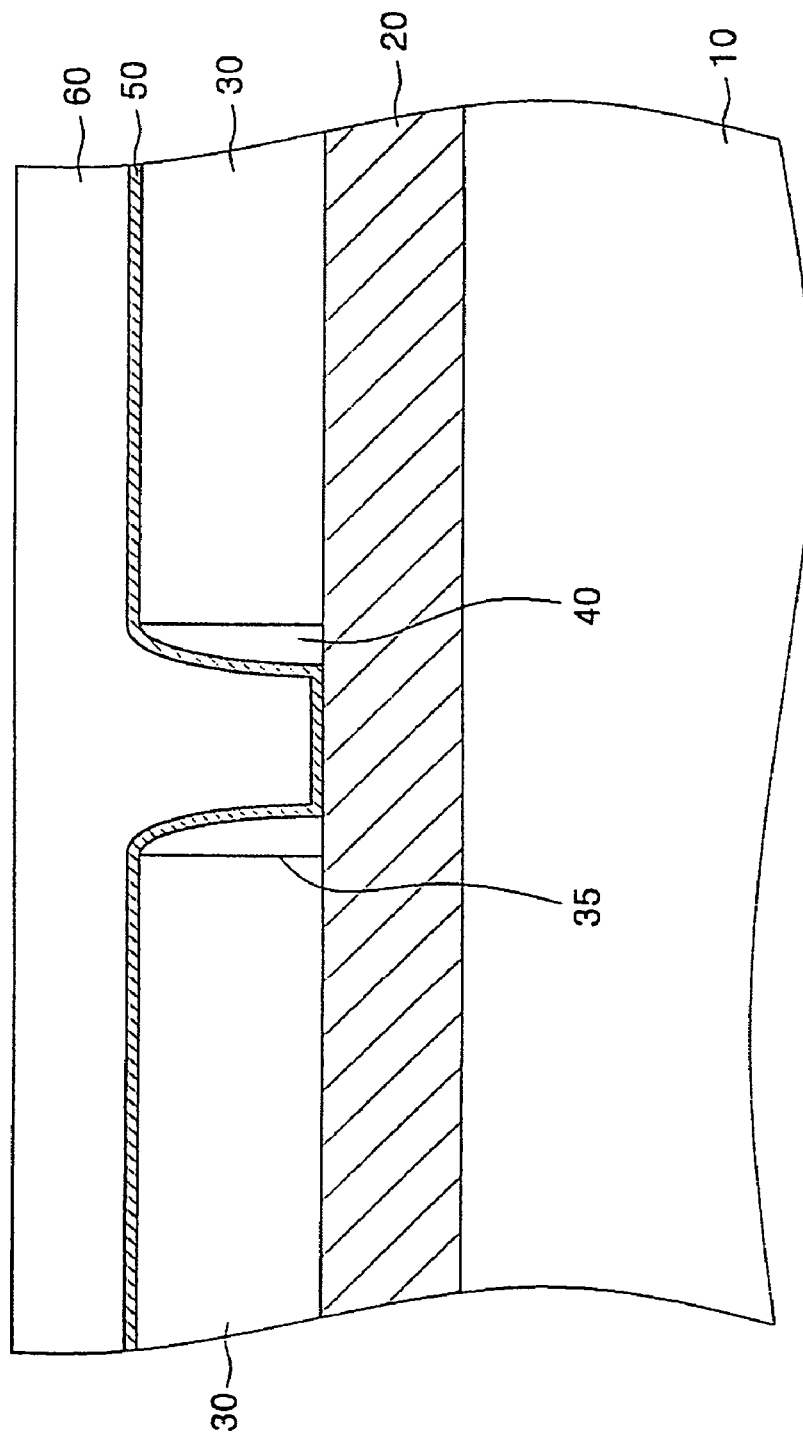
Figure 5:
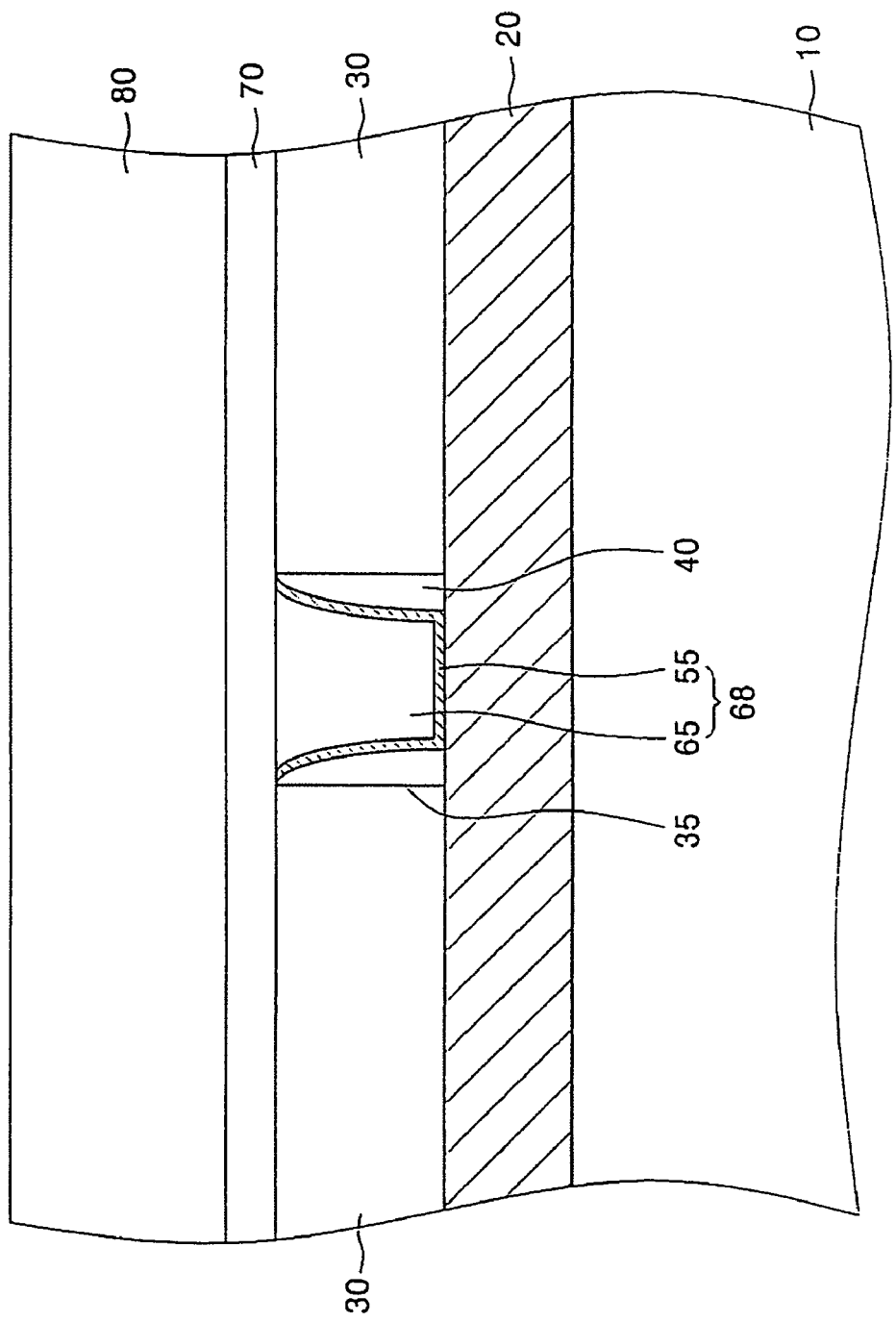

Referring to FIGS. 3 through 5, a lower line 20 is formed on a semiconductor substrate 10, and on the lower line 20 there is disposed a support interlayer insulating layer 30 including therein a lower contact hole 35. A contact hole spacer 40 is formed on, and in some embodiments covers, a sidewall of the lower contact hole 35. Then, a titanium (Ti) layer 50 and a titanium nitride (TiN) layer 60 are sequentially formed in, and in some embodiments fill, the lower contact hole 35 and on the support interlayer insulating layer 30. A planarization process is performed on the titanium nitride layer 60 and the titanium layer 50 to expose the support interlayer insulating layer 30, thereby forming a lower contact hole node 68 in the lower contact hole 35. The lower contact hole node 35 includes a titanium layer pattern 55 and a titanium nitride layer pattern 65, in some embodiments. The lower contact hole node 68 fills the lower contact hole 35 along with the contact hole spacer 40 in some embodiments. On the semiconductor substrate having the lower contact hole node 68 are sequentially formed an etch stop layer 70 and a pattern interlayer insulating layer 80.

In some embodiments, the pattern interlayer insulating layer 80 is formed of an insulating layer having an etching ratio different from the etch stop layer 70, and the same etching ratio as the support interlayer insulating layer 30, and the etch stop layer 70 is formed of an insulating layer having the same etching ratio as the contact hole spacer 40. The lower line 20 is formed of tungsten (W), in some embodiments.

Figure 6:
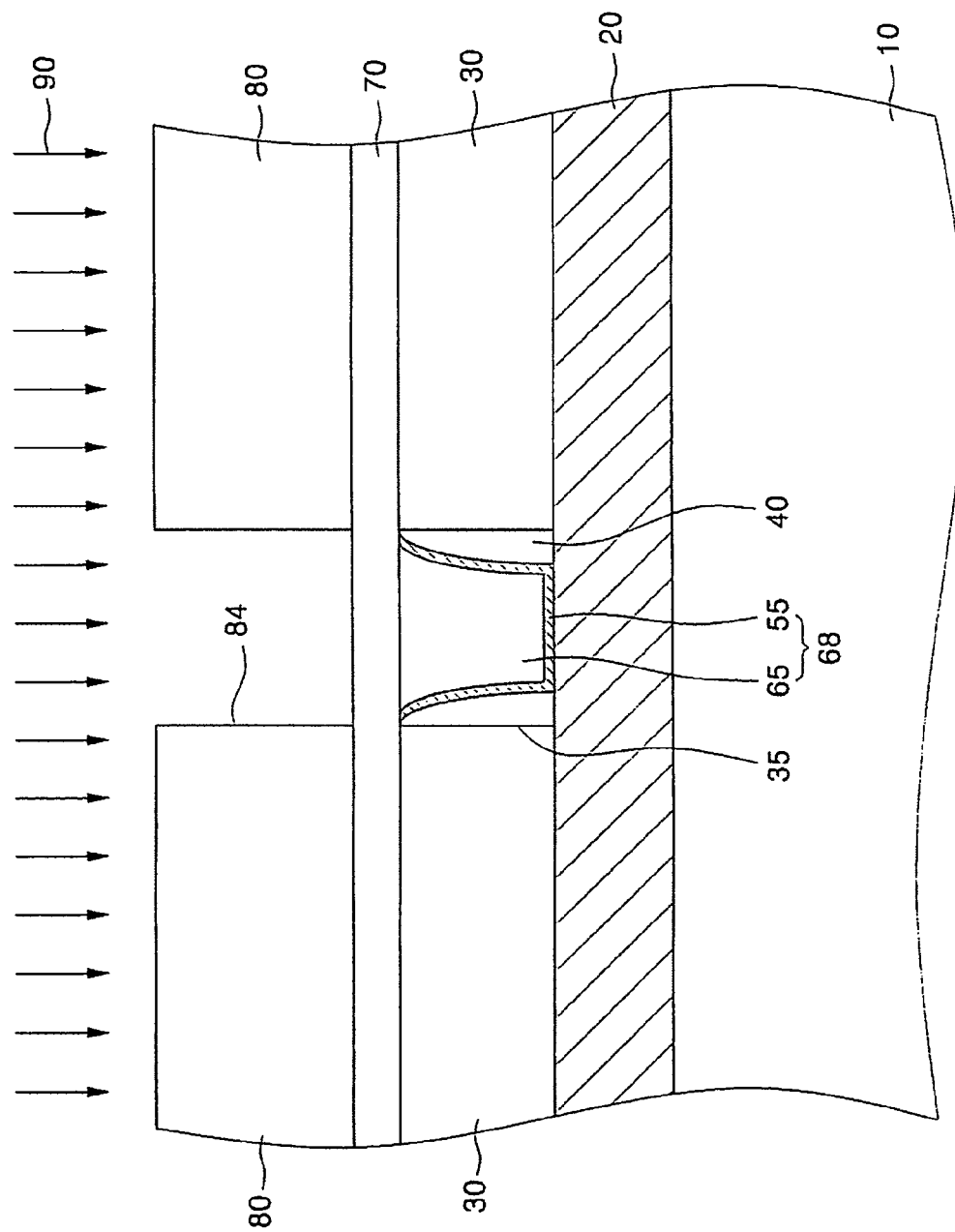
Figure 7:
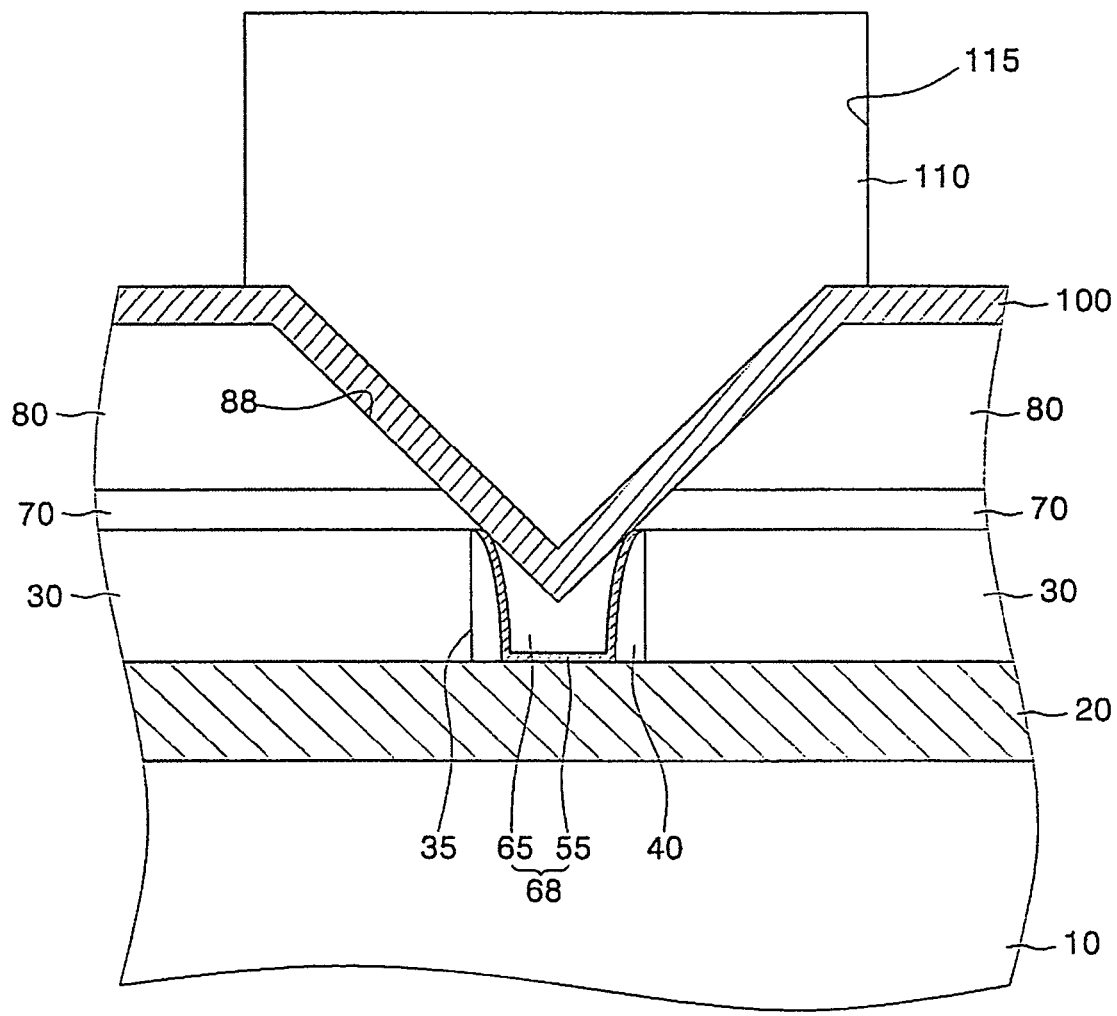
Figure 8:
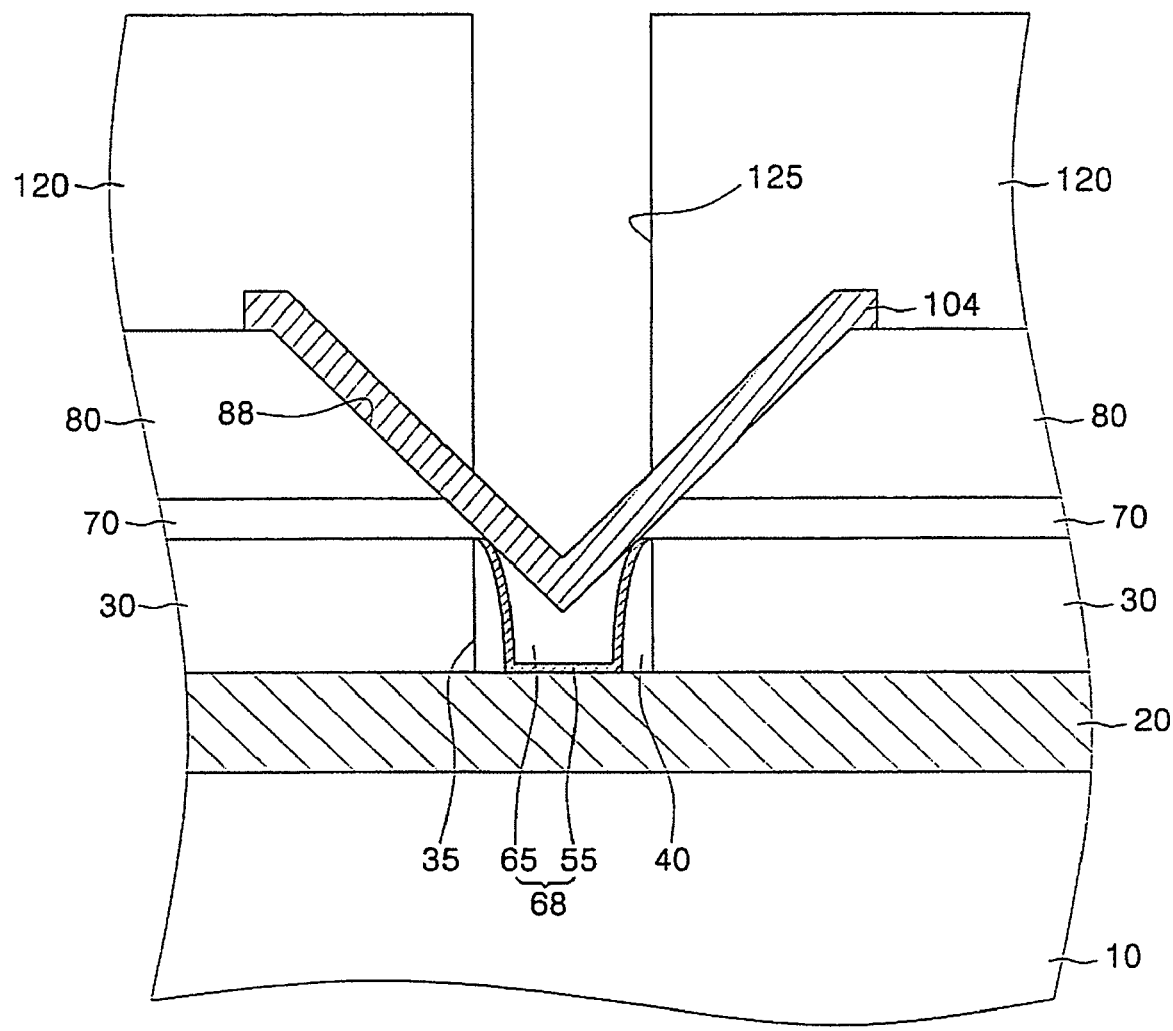

Referring to FIGS. 6 through 8, a middle contact hole 84 is formed penetrating the pattern interlayer insulating layer 80 to expose the etch stop layer 70. In some embodiments, the middle contact hole 84 is formed to coaxially align with a central axis of the lower contact hole 35. A diameter of the middle contact hole 84 is smaller than or equal to that of the lower contact hole 35 in some embodiments. An etching process 90 is performed on the pattern interlayer insulating layer 80 and the etch stop layer 70 through the middle contact hole 84 to form a contact hole 88 exposing the lower contact hole node 68. The etching process 90 is RF (radio frequency) sputtering in some embodiments. The illustrated contact hole 88 has a V-shaped structure, and an upper width of the contact hole 88 is wider than a diameter of the lower contact hole 35. A sharp tip of the contact hole 88 is formed on the central axis of the lower contact hole 35 and at a predetermined portion of the lower contact hole node 68.

A phase change layer 100 is formed on the pattern interlayer insulating layer 80 to conformally cover the contact hole 88. The phase change layer 100 includes a mixture of germanium (Ge), antimony (Sb) and tellurium (Te) in some embodiments. On the phase change layer 100 is formed a photoresist layer 110 having a photoresist pattern 115. The photoresist pattern 115 may be formed in a bar-shape or in a round-shape, and, in some embodiments, it is formed to have a width greater than the upper width of the contact hole 88. An etching process is performed on the phase change layer 100 using the photoresist pattern 115 as an etching mask to form a phase change layer pattern 104 overlapping the contact hole 88.

A line interlayer insulating layer 120 is formed on the patterned interlayer insulating layer 80 to cover the phase change layer pattern 104, and an upper contact hole 125 is formed penetrating the line interlayer insulating layer 120 to expose the phase change layer pattern 104. In some embodiments, the upper contact hole 125 is formed to coaxially align with the central axis of the lower contact hole 35, and the line interlayer insulating layer 120 is formed of an insulating layer having the same etching ratio as the pattern interlayer insulating layer 80.

Referring to FIGS. 9 through 12, the upper contact hole 125 is provided with, and in some embodiments filled with, an upper contact hole node 130, and an upper line 140 is formed on the line interlayer insulating layer 120 overlapping the upper contact hole node 130. In some embodiments, the upper contact hole node 130 is formed of a tungsten (W) layer, and the upper line 140 is formed of an aluminum (Al) layer. The upper contact hole node 130 contacts the phase change layer pattern 104 of FIG. 9, which is formed in the V-shaped structure along the contact hole 88.

A PRAM semiconductor device can be varied in its electrical characteristics depending on whether the contact hole 88 is present or not. The characteristics will be explained with reference to FIGS. 11 and 12 as enlarged views of portions P1, P2 of FIGS. 9 and 10. In the case of the phase change layer pattern 104 of FIG. 12, charges C1, C2 and C3 are present in the lower contact hole node 68 near the sharp tip of the phase change layer pattern 104. The charges C1, C2 and C3 generate an electric field EF, which is directed toward a center of the phase change layer pattern 104. The physical phenomenon as described above can be represented by using a Gaussian formula as follows:

$$\oint E \cdot A = \Phi, \tag{1}$$

wherein, E is electric field vector, A is Gaussian surface vector, and $\phi$ is charge in a Gaussian closed curve.

Equation (1) implies that an electric field EF only in a direction perpendicular to a Gaussian surface 153, 156 affects the electrical characteristics of the phase change layer pattern 104, which has the V-shaped structure. Therefore, the electric field EF of the charges C1, C2 and C3 is formed to concentrate toward a center of the phase change layer pattern 104 due to the V-shaped structure of the phase change layer pattern 104, and the concentration of the electric field EF of the charges C1, C2 and C3 generates Joule heat in the center of the phase change layer pattern 104. The Joule heat causes a phase change in the phase change layer pattern 104, and the phase change can change a crystalline structure 164 of the phase change layer pattern 104 to an amorphous structure 162 thereof. Therefore, the V-shaped phase change layer pattern 104 allows the electric field EF of the charges C1, C2 and C3 to be concentrated toward the center thereof, which may reduce or minimize current consumption for the phase change.

In contrast, as shown in FIG. 12, a phase change layer pattern 108 shows that an electric field EF of charges C4, C5 and C6 in the lower contact hole node 68 penetrates a Gaussian surface 159, and the charges C4, C5 and C6 individually contribute to a phase change of the phase change layer pattern 108. The phase change layer pattern 108 of FIG. 12 has a flat, bar-shaped structure. Thus, a current consumed for the phase change of the phase change layer pattern 108 and a time taken to complete the phase change thereof are generally greater than those of FIG. 11. The phase change of FIG. 12 may change more of the crystalline structure 168 of the phase change layer pattern 108 to the amorphous structure 166 thereof compared with the phase change layer pattern 104 of FIG. 11.

Figure 9:
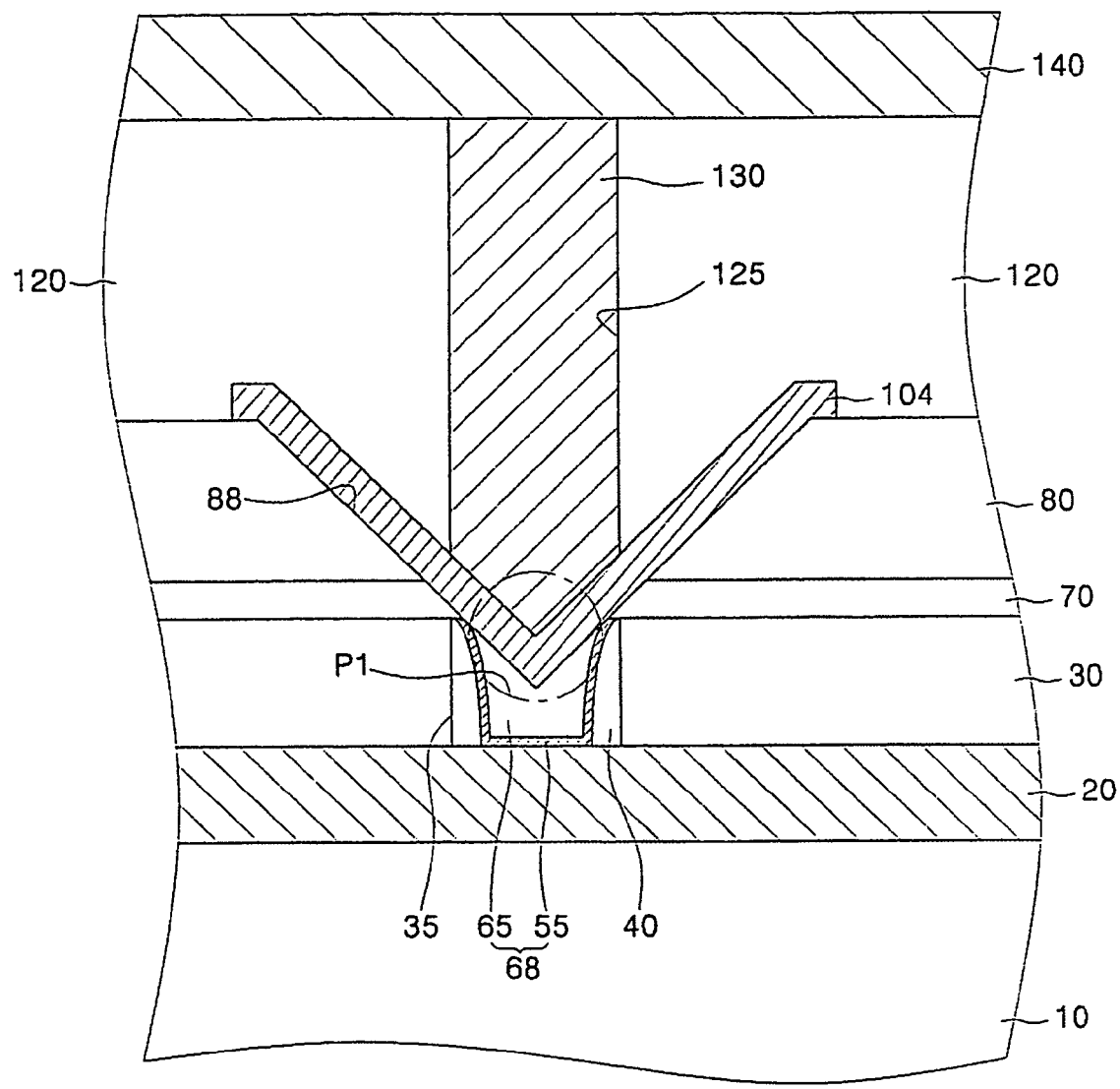
Figure 10:
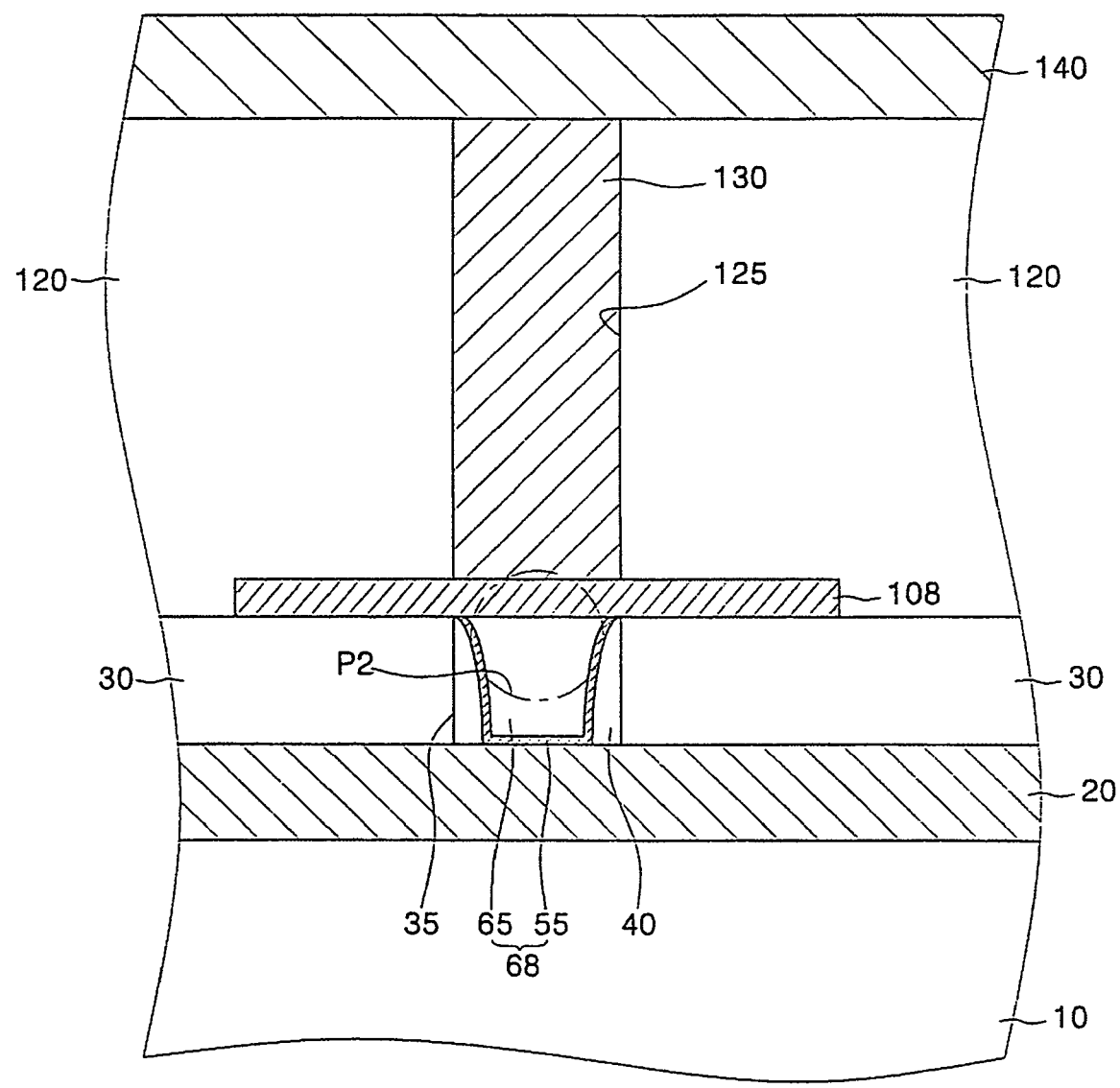
FIG. 10 is a sectional view of a conventional semiconductor memory device illustrating a portion to be compared with FIG. 9.
Figure 13:
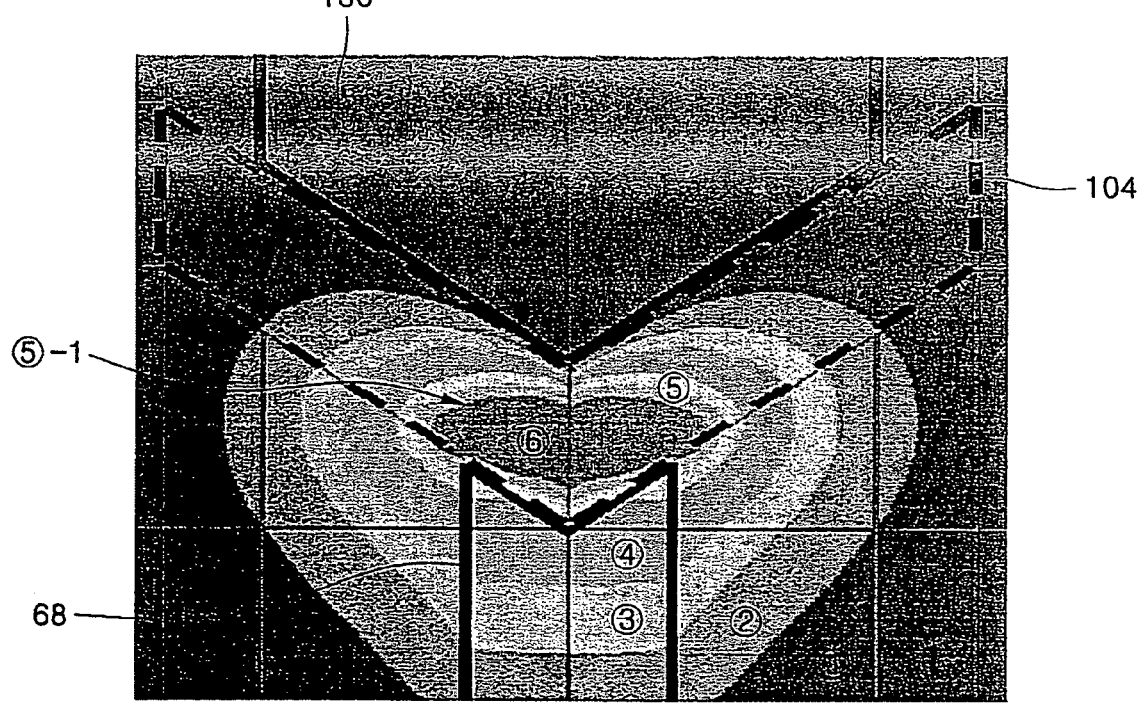
FIGS. 13 and 14 are temperature graphs obtained by simulation of devices of FIGS. 9 and 10, respectively.
Figure 14:
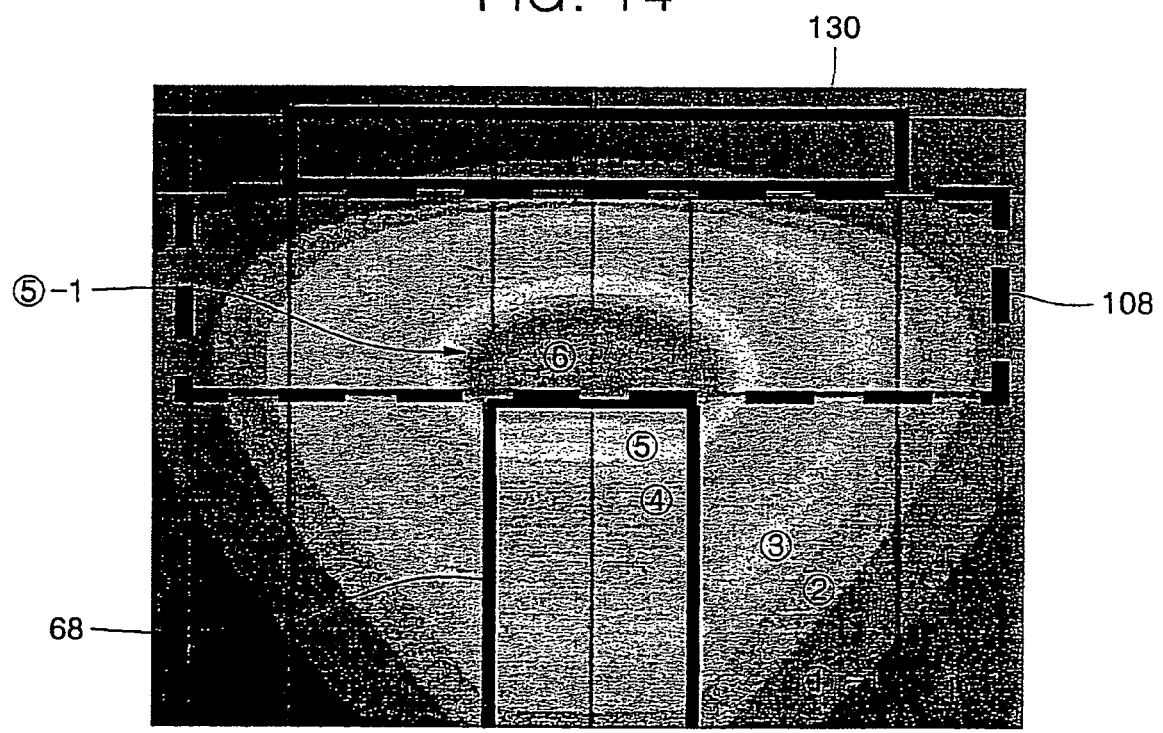

FIGS. 13 and 14 are temperature graphs obtained by simulation of devices of FIGS. 9 and 10, respectively.

Referring to FIGS. 9, 10, 13 and 14, a PRAM can cause a phase change in the phase change layer pattern by using the Joule heat during the operation thereof. The binary data may be defined as "0" when the phase change layer pattern has a crystalline structure, and the binary data may be defined as "1" when a portion of the crystalline structure in the phase change layer pattern has an amorphous structure. A PRAM having the binary data "1" has a temperature distribution in the phase change layer pattern and peripheral regions thereof.

First, as shown in FIG. 13, the current flowing through the lower and upper contact hole nodes 68, 130 exhibits temperature contours (①, ②, ③, ④, ⑤, ⑥) in the phase change layer pattern 104. The temperature contours (①, ②, ③, ④, ⑤, ⑥) show temperatures that rapidly decrease from the center of the phase change layer pattern 104 to the peripheral regions thereof. The phase change layer pattern 104 has a highest temperature in the center thereof and a lowest temperature in the outermost portions of the peripheral regions. This is because an electric field EF of the charges C1, C2 and C3 of FIG. 11, which flow through the lower contact hole node 68 and the upper contact hole node 130 is concentrated toward the center of the phase change layer pattern 104 to generate the phase change thereof. The electric field EF can reduce the loss of the Joule heat emitted from the phase change layer pattern to reduce or minimize current consumption for the phase change. Further, the concentration of the electric field EF supports the description in FIG. 11, and moves the critical temperature (⑤-1) of generating the phase change from the sharp tip of the phase change layer pattern 104 to a predetermined location of the center thereof. Two (①, ⑥) of the temperature contours (①, ②, ③, ④, ⑤, ⑥) show absolute temperatures 300K and 1000K, respectively, and the remainder (②, ③, ④, ⑤) show absolute temperatures between them (①, ⑥).

In contrast, in FIG. 14, the current flowing through the lower and upper contact hole nodes 68, 130 exhibits temperature contours (①, ①-1, ②, ③, ④, ⑤, ⑥). The phase change layer pattern 108 has a highest temperature in the center thereof and a lowest temperature in the outermost of the peripheral regions thereof. The temperature contours show temperature that is gradually decreased from a center of the phase change layer pattern 108 toward peripheral regions thereof. This is because the phase change layer pattern 108 may use more current to generate the phase change thereof in comparison with FIG. 13. This means that a Joule heat of the phase change layer pattern 108 may be lost in the peripheral regions during the phase change more than the case of FIG. 13, so that it generally takes longer to change a portion of a crystalline structure of the phase change layer pattern 108 to an amorphous structure thereof. Further, the Joule heat may be lost because a critical temperature (⑤-1) causing the phase change of the phase change-layer pattern 108 begins from a lower surface thereof compared with FIG. 13. Two (①, ⑥) of the temperature contours (①, ①-1, ②, ③, ④, ⑤, ⑥) show absolute temperatures 300K and 1000K, respectively, and the remainder (①-1, ②, ③, ④, ⑤) show absolute temperature between them (①, ⑥).

As described above, according to some embodiments of the invention, the phase change layer pattern is formed in the V-shaped structure on the semiconductor substrate, thereby reducing or minimizing current consumption for the phase change during the operation of the PRAM. Therefore, a PRAM having the V-shaped phase change layer pattern can have a low driving current for the operation thereof, and is capable of exhibiting good performance.

Exemplary embodiments of the invention will now be described in a non-limiting way. Exemplary embodiments of the invention provide semiconductor devices having a phase change layer pattern and methods of forming the same.

According to exemplary embodiments of the invention, semiconductor devices having a phase change layer pattern that includes a V-shaped phase change layer pattern disposed above a semiconductor substrate are provided. The V-shaped phase change layer pattern has a sharp tip in a direction toward an upper surface of the semiconductor substrate. A portion of a lower surface of the a V-shaped phase change layer pattern is surrounded by an etch stop layer and a pattern interlayer insulating layer stacked thereon. A support interlayer insulating layer is disposed between the etch stop layer and the semiconductor substrate, the support interlayer insulating layer including a lower contact hole. The lower contact hole includes therein a contact hole spacer and a lower contact hole node. A remainder of the lower surface of the V-shaped phase change layer pattern contacts the lower contact hole node, and the sharp tip thereof is disposed on a central axis of the lower contact hole and in a predetermined portion of the lower contact hole node.

According to exemplary embodiments of the invention, there is provided methods of fabricating semiconductor devices having a phase change layer pattern that includes forming a support interlayer insulating layer having a lower contact hole on a semiconductor substrate. A contact hole spacer is formed on a sidewall of the lower contact hole. A lower contact hole node is formed to be in contact with the contact hole spacer to fill the lower contact hole. An etch stop layer and a pattern interlayer insulating layer are formed on the semiconductor substrate having the lower contact hole node. A middle contact hole is formed on the etch stop layer by penetrating the pattern interlayer insulating layer. An etching process is performed in the pattern interlayer insulating layer and the etch stop layer through the middle contact hole to form a V-shaped contact hole exposing the lower contact hole node. A phase change layer pattern is conformally formed in the contact hole and on the interlayer insulating layer to overlap the contact hole. The middle contact hole and the contact hole are formed to coaxially align a central axis of the lower contact hole, and a sharp tip of the contact hole is formed on the central axis of the lower contact hole in a predetermined portion of the lower contact hole.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A memory device comprising:
   a V-shaped phase change layer pattern disposed on a substrate, the V-shaped phase change layer pattern having a sharp tip that is closer to the substrate than remaining portions of the V-shaped phase change layer pattern, a portion of the V-shaped phase change layer pattern remote from the sharp tip including an etch stop layer and a pattern interlayer insulating layer stacked thereon; and
   a support interlayer insulating layer disposed between the etch stop layer and the semiconductor substrate and including therein a lower contact hole, the lower contact hole including therein a contact hole spacer and a lower contact hole node, wherein a portion of the V-shaped phase change layer pattern that is adjacent the sharp tip contacts the lower contact hole node, and wherein the etch stop layer comprises an insulating layer having an etching ratio different from the pattern interlayer insulating layer.

2. A memory device comprising:
   a V-shaped phase change layer pattern disposed on a substrate, the V-shaped phase change layer pattern having a sharp tip that is closer to the substrate than remaining portions of the V-shaped phase change layer pattern, a portion of the V-shaped phase change layer pattern remote from the sharp tip including an etch stop layer and a pattern interlayer insulating layer stacked thereon; and
   a support interlayer insulating layer disposed between the etch stop layer and the semiconductor substrate and including therein a lower contact hole, the lower contact hole including therein a contact hole spacer and a lower contact hole node, wherein a portion of the V-shaped phase change layer pattern that is adjacent the sharp tip contacts the lower contact hole node, and wherein the pattern interlayer insulating layer comprises an insulating layer having a same etching ratio as the support interlayer insulating layer.

3. The memory device according to claim 1, wherein the phase change layer pattern comprises at least three elements.

4. The memory device according to claim 3, wherein the phase change layer pattern comprises germanium (Ge), antimony (Sb) and tellurium (Te).

5. The memory device according to claim 1, wherein the contact hole spacer comprises an insulating layer having an etching ratio different from the support interlayer insulating layer.

6. A memory device comprising:
   a V-shaped phase change layer pattern disposed on a substrate, the V-shaped phase change layer pattern having a sharp tip that is closer to the substrate than remaining portions of the V-shaped phase change layer pattern, a portion of the V-shaped phase change layer pattern remote from the sharp tip including an etch stop layer and a pattern interlayer insulating layer stacked thereon; and
   a support interlayer insulating layer disposed between the etch stop layer and the semiconductor substrate and including therein a lower contact hole, the lower contact hole including therein a contact hole spacer and a lower contact hole node, wherein a portion of the V-shaped phase change layer pattern that is adjacent the sharp tip contacts the lower contact hole node, and wherein the lower contact hole node comprises a titanium layer and a titanium nitride layer stacked thereon.

7. The memory device according to claim 1, wherein a width of the phase change layer pattern remote from the sharp tip is greater than a width of the lower contact hole.

8. The memory device according to claim 1, further comprising:
   a line interlayer insulating layer on the pattern interlayer insulating layer and the phase change layer pattern;

an upper contact hole exposing the phase change layer pattern by penetrating the line interlayer insulating layer;

an upper contact hole node in the upper contact hole, wherein the upper contact hole node contacts the phase change layer pattern through the upper contact hole.

9. The memory device according to claim 1, further comprising a lower line disposed between the support interlayer insulating layer and the substrate and connected to the lower contact hole node.

10. A Phase change Random Access Memory (PRAM) comprising:

a substrate;

a phase change layer pattern on the substrate, the phase change layer pattern including an outside surface adjacent the substrate that is V-shaped in side cross-section and an inside surface remote from the substrate that also is V-shaped in side cross-section, the inside and outside surfaces that are V-shaped in side cross-section also defining a sharp tip, the inside and outside surfaces that are V-shaped in side cross-section also extending from the sharp tip away from the substrate; and at least one contact hole node that contacts the phase change layer pattern adjacent the sharp tip.

11. A PRAM according to claim 10 wherein the phase change layer pattern is cone-shaped, with the sharp tip defining a vertex of the cone.

12. A PRAM according to claim 10 wherein the inside and outside surfaces that are V-shaped in side cross-section extend from the sharp tip away from the substrate and beyond the at least one contact hole node.

13. A PRAM according to claim 12 wherein the at least one contact hole node comprises:

a first contact hole node that extends from adjacent the substrate to contact the sharp tip at the outside surface; and a second contact hole node that contacts the sharp tip at the inside surface and extends away from the substrate.

14. A PRAM according to claim 10 further comprising an insulating layer on the substrate and including a hole therein, and wherein the sharp tip is within the hole and the inside and outside surfaces that are V-shaped in side cross section extend from the sharp tip beyond the hole.

15. The memory device according to claim 2, wherein the phase change layer pattern comprises at least three elements.

16. The memory device according to claim 15, wherein the phase change layer pattern comprises germanium (Ge), antimony (Sb) and tellurium (Te).

17. The memory device according to claim 2, wherein the contact hole spacer comprises an insulating layer having an etching ratio different from the support interlayer insulating layer.

18. The memory device according to claim 2, wherein a width of the phase change layer pattern remote from the sharp tip is greater than a width of the lower contact hole.

19. The memory device according to claim 2, further comprising:

a line interlayer insulating layer on the pattern interlayer insulating layer and the phase change layer pattern;

an upper contact hole exposing the phase change layer pattern by penetrating the line interlayer insulating layer;

an upper contact hole node in the upper contact hole, wherein the upper contact hole node contacts the phase change layer pattern through the upper contact hole.

20. The memory device according to claim 2, further comprising a lower line disposed between the support interlayer insulating layer and the substrate and connected to the lower contact hole node.

21. The memory device according to claim 6, wherein the phase change layer pattern comprises at least three elements.

22. The memory device according to claim 6, wherein the phase change layer pattern comprises germanium (Ge), antimony (Sb) and tellurium (Te).

23. The memory device according to claim 6, wherein the contact hole spacer comprises an insulating layer having an etching ratio different from the support interlayer insulating layer.

24. The memory device according to claim 6, wherein a width of the phase change layer pattern remote from the sharp tip is greater than a width of the lower contact hole.

25. The memory device according to claim 6, further comprising:

a line interlayer insulating layer on the pattern interlayer insulating layer and the phase change layer pattern;

an upper contact hole exposing the phase change layer pattern by penetrating the line interlayer insulating layer;

an upper contact hole node in the upper contact hole, wherein the upper contact hole node contacts the phase change layer pattern through the upper contact hole.

26. The memory device according to claim 6, further comprising a lower line disposed between the support interlayer insulating layer and the substrate and connected to the lower contact hole node.

* * * * *